(12) United States Patent
Polak et al.

(10) Patent No.: US 10,028,411 B2
(45) Date of Patent: Jul. 17, 2018

(54) ELECTRONIC CONTROLLER WITH LASER WELD SEALED HOUSING

(71) Applicant: Continental Automotive Systems, Inc., Auburn Hills, MI (US)

(72) Inventors: Anthony J Polak, Lake Zurich, IL (US); Jared Yagoda, Wauconda, IL (US); Gerry Bianco, Elgin, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 15/219,402

(22) Filed: Jul. 26, 2016

(65) Prior Publication Data

US 2018/0035567 A1 Feb. 1, 2018

(51) Int. Cl.
| | |
|---|---|
| *H05K 1/02* | (2006.01) |
| *H05K 7/20* | (2006.01) |
| *H05K 5/00* | (2006.01) |

(52) U.S. Cl.
CPC ......... *H05K 7/2039* (2013.01); *H05K 5/0017* (2013.01); *H05K 5/0082* (2013.01); *H05K 7/20854* (2013.01)

(58) Field of Classification Search
CPC .. H05K 1/02; H05K 3/28; H05K 3/32; H05K 3/284; H05K 3/325; H05K 5/02; H05K 5/04; H05K 5/17; H05K 5/142; H05K 5/213; H05K 5/217; H05K 5/1675; H05K 7/14; H05K 7/142; H05K 7/1069; H01L 21/00; H01L 23/04
USPC ... 361/720, 71, 72, 704, 713, 736, 752, 753, 361/757; 257/698; 174/535, 547, 562; 333/246
See application file for complete search history.

(56) References Cited

U.S. PATENT DOCUMENTS

| | | | | | |
|---|---|---|---|---|---|
| 4,345,810 | A | * | 8/1982 | Bakermans | H05K 7/1069 439/331 |
| 4,346,952 | A | * | 8/1982 | Bright | H05K 7/1069 439/70 |
| 4,480,240 | A | * | 10/1984 | Gould | H01P 3/081 333/246 |
| 4,885,126 | A | * | 12/1989 | Polonio | H05K 3/325 174/16.3 |
| 4,914,954 | A | * | 4/1990 | Zlamal | F02D 41/00 73/431 |
| 4,925,393 | A | * | 5/1990 | Ingalsbe | H01R 31/02 439/638 |

(Continued)

*Primary Examiner* — Xiaoliang Chen

(57) ABSTRACT

An electronic controller having a housing, and a lower sub-assembly connected to a housing through the use of a laser weld, eliminating the use of a gasket and fasteners. The laser weld provides a sealed connection between the housing and the lower sub-assembly, preventing debris, moisture, oils, ATF, and chemicals from entering the housing, which protects the electrical components located inside the housing. The elimination of the gasket and fasteners also reduces the cost of the electronic controller. Depending upon the application, the electrical components may be mounted directly to the lower sub-assembly, or the electrical components may be mounted on a metal core. The metal core is used to provide heat dissipation and function as an electrical conductor. The lower sub-assembly may either be overmolded around the metal core, or the metal core may be attached to the lower sub-assembly after the lower sub-assembly has been formed.

9 Claims, 3 Drawing Sheets

(56) References Cited

U.S. PATENT DOCUMENTS

| | | | |
|---|---|---|---|
| 5,040,097 A * | 8/1991 | Stribel | B60R 16/0238 361/679.31 |
| 5,065,282 A * | 11/1991 | Polonio | H01L 24/32 174/547 |
| 5,256,901 A * | 10/1993 | Ohashi | G11C 5/00 174/521 |
| 5,342,707 A * | 8/1994 | Brooks | H01M 2/1055 220/324 |
| 5,355,352 A * | 10/1994 | Kobayashi | G04G 9/0064 368/10 |
| 5,592,362 A * | 1/1997 | Ohgami | G06F 1/1616 361/679.41 |
| 5,689,089 A * | 11/1997 | Polak | H01L 23/057 174/521 |
| 5,755,026 A * | 5/1998 | Stephan | H05K 3/284 29/825 |
| 6,051,784 A * | 4/2000 | Yoon | H01L 23/057 174/538 |
| 6,396,694 B1 * | 5/2002 | van den Berg | H05K 3/284 257/787 |
| 6,756,667 B2 * | 6/2004 | Hiyoshi | H01L 25/072 257/584 |
| 6,765,801 B1 * | 7/2004 | Glenn | H01S 5/022 174/535 |
| 7,209,360 B1 * | 4/2007 | Yarza | H05K 5/064 174/520 |
| 7,403,837 B2 * | 7/2008 | Graiger | G05B 19/409 361/71 |
| 8,328,092 B1 * | 12/2012 | Robinson | G06K 19/048 235/382 |
| 9,226,412 B2 * | 12/2015 | Pinol Pedret | H01M 10/48 |
| 2003/0128552 A1 * | 7/2003 | Takagi | G02B 6/4201 362/555 |
| 2004/0087192 A1 * | 5/2004 | Ohta | H02G 3/088 439/76.1 |
| 2005/0130479 A1 * | 6/2005 | Ma | H01R 12/88 439/342 |
| 2005/0145472 A1 * | 7/2005 | Beckwith | G08G 1/005 200/521 |
| 2006/0207098 A1 * | 9/2006 | Tamaoka | H02K 5/1675 29/898.02 |
| 2007/0081056 A1 * | 4/2007 | Ito | B41J 2/17596 347/85 |
| 2009/0127697 A1 * | 5/2009 | Pahl | B81B 7/0054 257/698 |
| 2009/0206703 A1 * | 8/2009 | Reichenbach | B60C 23/0411 310/339 |
| 2009/0314540 A1 * | 12/2009 | Yui | G06F 1/181 174/535 |
| 2013/0100620 A1 * | 4/2013 | Christoph | B60R 16/0239 361/752 |
| 2015/0061495 A1 * | 3/2015 | Bertken | H05B 33/0854 315/86 |
| 2015/0070852 A1 * | 3/2015 | Kawano | H05K 7/142 361/736 |

* cited by examiner

ELECTRONIC CONTROLLER WITH LASER WELD SEALED HOUSING

FIELD OF THE INVENTION

The invention relates generally to an electronics controller which includes a lower sub-assembly attached to a housing using a laser weld to provide a sealed connection between the lower sub-assembly and the housing, protecting the electronic components inside the housing from exposure to moisture, oils, automatic transmission fluid (ATF), chemicals, and debris.

BACKGROUND OF THE INVENTION

Electronic controllers are generally known. Many transmission controllers, engine controllers, and the like have some type of metal base plate, upon which electronic components are mounted. The base plate is then connected to a housing such that the electronic components are located in the cavity of the housing. The base plate is typically some type of die casting, and provides the functions of heat dissipation, serves as an electrical conductor and mounting surface for the electronic components, and is also used in combination with a gasket to provide a seal between the base plate and the housing. Several fasteners, such as screws, are used to connect the housing to the base plate.

Many of these controllers suffer issues with leaks due to the failure of the gasket. Accordingly, there exists a need for an electronic controller having a base plate and a housing which are configured in such a manner so as to reduce or eliminate leaking due to gasket failure.

SUMMARY OF THE INVENTION

The present invention is an electronic controller which eliminates the use of a gasket and fasteners, and incorporates the use of a lower sub-assembly, with the lower sub-assembly connected to a housing through the use of a laser weld. The laser weld provides a sealed connection between the housing and the lower sub-assembly, preventing debris, moisture, oils, ATF, and chemicals from entering the housing. The elimination of the gasket and fasteners also reduces the cost of the electronic controller.

Any necessary electrical components are disposed in the housing and, depending upon the application, may be mounted directly to the lower sub-assembly, or the electrical components may be mounted on a metal core. The metal core is used to provide heat dissipation and function as an electrical conductor. The lower sub-assembly may either be overmolded around the metal core, or the metal core may be attached to the lower sub-assembly using an adhesive, such as a thermally conductive adhesive, after the lower sub-assembly has been formed.

In one embodiment, the present invention is an electronic controller which includes a housing, an outer wall formed as part of the housing, a lower sub-assembly, a core connected to the lower sub-assembly, and at least one connection area which is part of the lower sub-assembly. In one embodiment, the lower sub-assembly is connected to the housing at the connection area using a laser weld, but it is within the scope of the invention that other types of welds may be used. In one embodiment, the lower sub-assembly is made of a plastic material which provides for a suitable weldable surface at the connection areas.

In one embodiment, an electronic substrate is disposed in the housing and connected to a top surface of the core, and various electrical components are wire bonded to the electronic substrate. In an alternate embodiment, the electrical components are wire bonded to the electronic substrate, the terminals of a lead frame, or both the electronic substrate and the terminals of the lead frame.

The lower sub-assembly is a plastic material which is overmolded, or injection molded, around the core, but leaves an area of the core exposed, such that the exposed area is uncovered by the lower sub-assembly. The electronic substrate is connected to the core in the exposed area. In one embodiment, the electronic substrate is then wirebonded to the core, where the wire bond connections are also in the exposed area of the core. In an alternate embodiment, the electronic substrate may also be wirebonded to the terminals of the lead frame to provide power to the electronic substrate, and may also function to allow for signals to be transferred to and from the electronic substrate. The core is made of a metal material, such as aluminum, to provide a suitable electrical connection to the electronic substrate, as well as function as a heat sink, because the aluminum is a suitable thermal transfer media.

The core has at least one side surface adjacent the top surface, and a bottom surface adjacent the side surfaces. In one embodiment, when the lower sub-assembly is overmolded around the core, the lower sub-assembly substantially covers the bottom surface, and the side surfaces, and a portion of the top surface, with the exception of the exposed area. In another embodiment, when the molded portion is molded around the core, the molded portion substantially covers the bottom surface, and may cover some or all of the side surfaces, leaving the entire top surface exposed.

In one embodiment, the lower sub-assembly is formed separately, an adhesive layer is placed on the lower sub-assembly, and the core is placed on to the adhesive layer. In other embodiments, the core is not used, and the electronic substrate is directly connected to the adhesive layer.

In yet another embodiment, there is a recessed portion formed as part of the lower sub-assembly. The thermally conductive adhesive layer is located in the recessed portion, and the core is positioned on the thermally conductive adhesive layer such that a portion of the core is disposed in the recessed portion.

In one embodiment, the adhesive layer is a thermal conductive adhesive layer, but it is within the scope of the invention that other types of adhesive layers may be used, such as, but not limited to, a pressure sensitive adhesive, a room temperature vulcanization adhesive, an electrically conductive adhesive, and the like.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
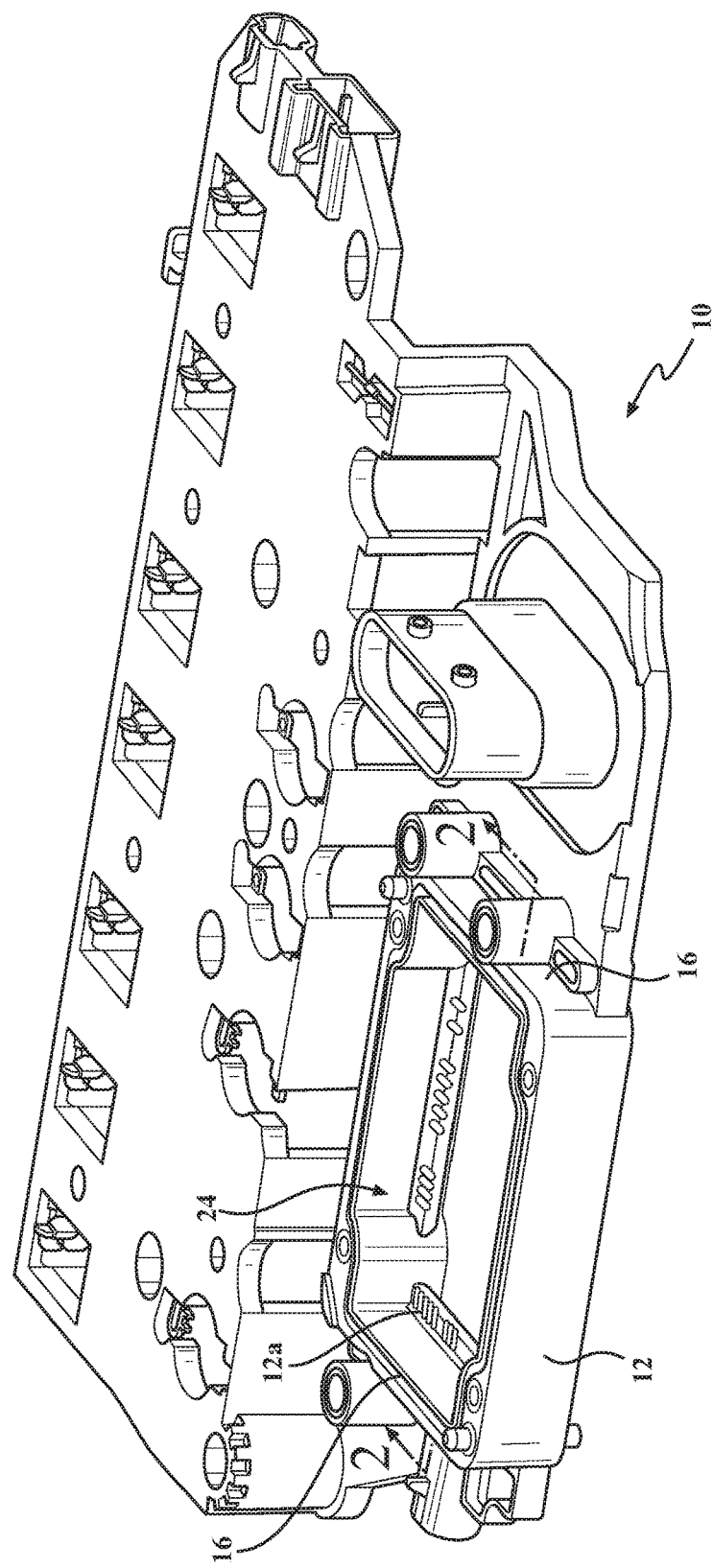
FIG. 1 is a perspective view of a first embodiment of an electronic controller, according to embodiments of the present invention.
Figure 2:
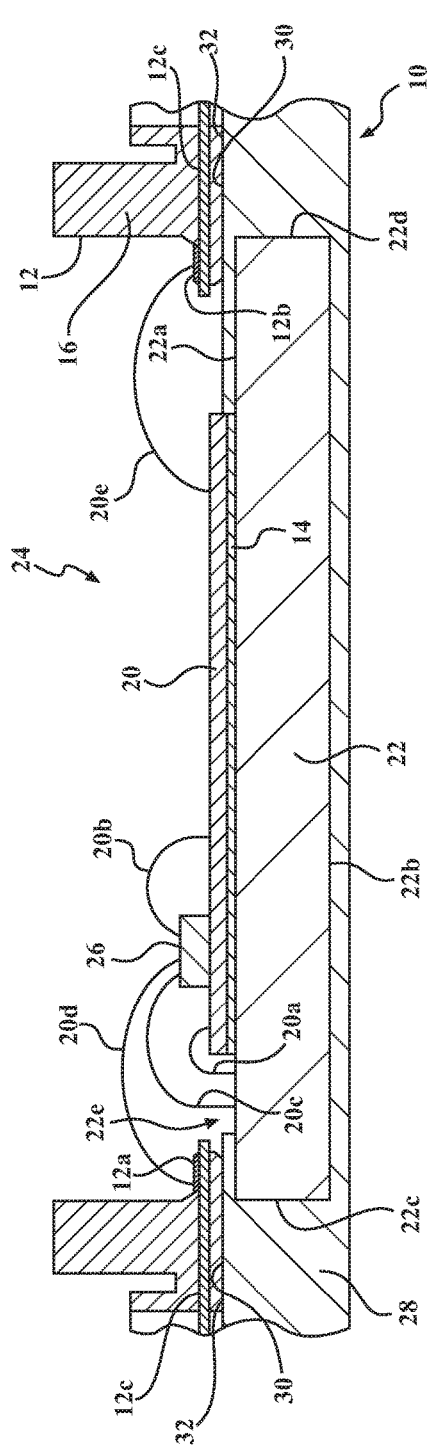
FIG. 2 is a sectional view taken along lines 2-2 of FIG. 1.

An electronic controller according to the present invention is shown in FIGS. 1-2 generally at 10. The controller 10 includes a housing 12, and formed as part of the housing 12 is a wall 16. There is an electronic substrate 20 in electronic communication with a core 22 during assembly, using a wire bond connection, shown at 20a. Although an electronic substrate 20 is used as shown, it is within the scope of the invention that other devices may be used, such as, but not limited to, a printed circuit board (PCB), a low temperature co-fired ceramic (LTCC) device, a high temperature co-fired ceramic (HTCC) device, or the like. Integrally formed with the side wall 16 is a top portion (not shown) of the housing 12, and the top portion and side wall 16 form a cavity, shown generally at 24, of the housing 12 are other various components, an example of which is an electrical component 26, which is in electrical communication with the electronic substrate 20 through a connection such as a wire bond 20b. The electrical component 26 may also be wire bonded to the core 22 using another wire bond 20c. The core 22 is made of a metal material, such as aluminum, to provide a suitable electrical connection to the electronic substrate 20, as well as function as a heat sink, because the aluminum is a suitable thermal transfer media. The core 22 may also function to electrically ground the electronic substrate 20 and the electrical component 26. However, it is within the scope that other materials may be used to create the core, such as, but not limited to, steel or copper. Also included are one or more leads 12a, 12b, which are part of a lead frame 12c, where the housing 12 is overmolded around the lead frame 12c. The electronic substrate 20 as well as the electrical component 26 may be connected to one or more of the leads 12a, 12b using a connection such as a wire bond 20d, 20e, as shown in FIG. 2, placing the electronic substrate 20 and the electrical component 26 in electrical communication with the lead frame 12c. The lead frame 12c may function to provide power from a power source, or send signals to the electrical component 26 or the electronic substrate 20.

The core 22 is partially surrounded by a lower sub-assembly 28. The lower sub-assembly 28 is made of a laser transparent plastic material. During assembly, the core 22 is placed in a mold, and the plastic material is injected into the mold and formed around the core 22 such that the core 22 is partially surrounded by the lower sub-assembly 28 as shown in FIG. 2. The core 22 has a top surface 22a, a bottom surface 22b, and several side surfaces, where two of the side surfaces 22c, 22d are shown in FIG. 2. In this embodiment, the plastic material of the lower sub-assembly 28 fully covers the bottom surface 22b, and the side surfaces 22c, 22d.

However, only a portion of the top surface 22a is covered by the lower sub-assembly 28. An area of the top surface 22a is left uncovered, and this exposed area, shown generally at 22e, is used for attachment with the electronic substrate 20 and wire bonding. The area of the top surface 22a left uncovered may vary, depending upon how the plastic material is formed around the core 22. There may be a "picture frame" configuration of plastic material on the top surface 22a, or there may be one or more plastic strips or "claws" on the top surface 22a. Other configurations of the plastic material molded around a portion of the top surface 22a are also possible. In this embodiment, the electronic substrate 20 is attached to the core 22 using an adhesive 14, such as a thermally conductive adhesive (TCA). The electrical component 26 may also be connected to the electronic substrate 20 using an adhesive, a solder connection, or any other suitable connection. The lower sub-assembly 28 is then attached to the outer wall 16, as shown in FIG. 2. In this embodiment, there is a connection area 30 which circumscribes the outer wall 16, and the lower sub-assembly 28 is connected to the outer wall 16 along the connection area 30. The connection between the lower sub-assembly 28 and the outer wall 16 of the housing 12 is a laser weld connection 32, but it is within the scope of the invention that other types of connections may be used.

Figure 3:
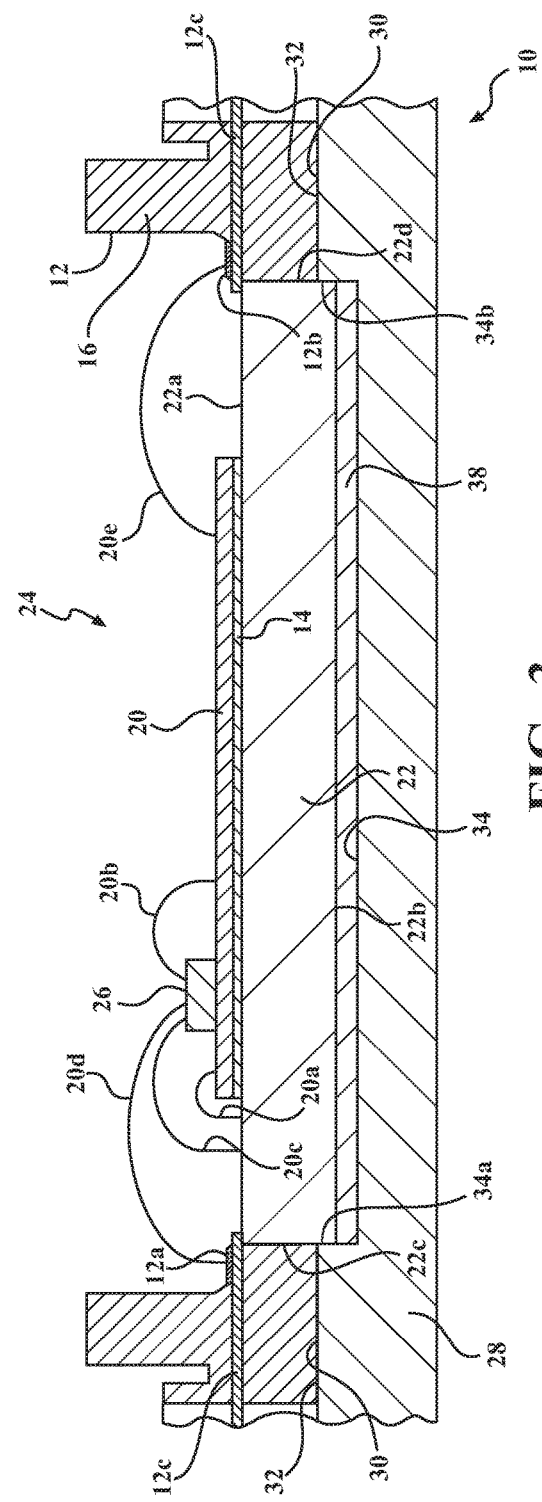
FIG. 3 a sectional view of a second embodiment of an electronic controller, according to embodiments of the present invention.

Another embodiment of a controller 10 according to the present invention is shown in FIG. 3, with like numbers referring to like elements. In this embodiment, the lower sub-assembly 28 is formed separately from the core 22, and the lower sub-assembly 28 includes a recessed portion 34. The lower sub-assembly 28 is fully formed as shown in FIG. 3 prior to any connection with the core 22 or the housing 12. During assembly, a layer of TCA 38 is deposited in the recessed portion 34 as shown in FIG. 3. The core 22 is then placed on the TCA layer 38, securing the core 22 to the lower sub-assembly 28. The recessed portion 34 has side walls, and two of the side walls 34a, 34b are shown in FIG. 3. When assembled, the recessed portion 34 is deep enough such that a portion of the side surfaces 22c, 22d are adjacent the side walls 34a, 34b. As with the previous embodiment, the electronic substrate 20 is connected to and in electrical communication with the core 22 using the wire bond connection 20a, and the electrical component 26 is connected to and in electrical communication with the electronic substrate 20 using the wire bond 20b.

Figure 4:
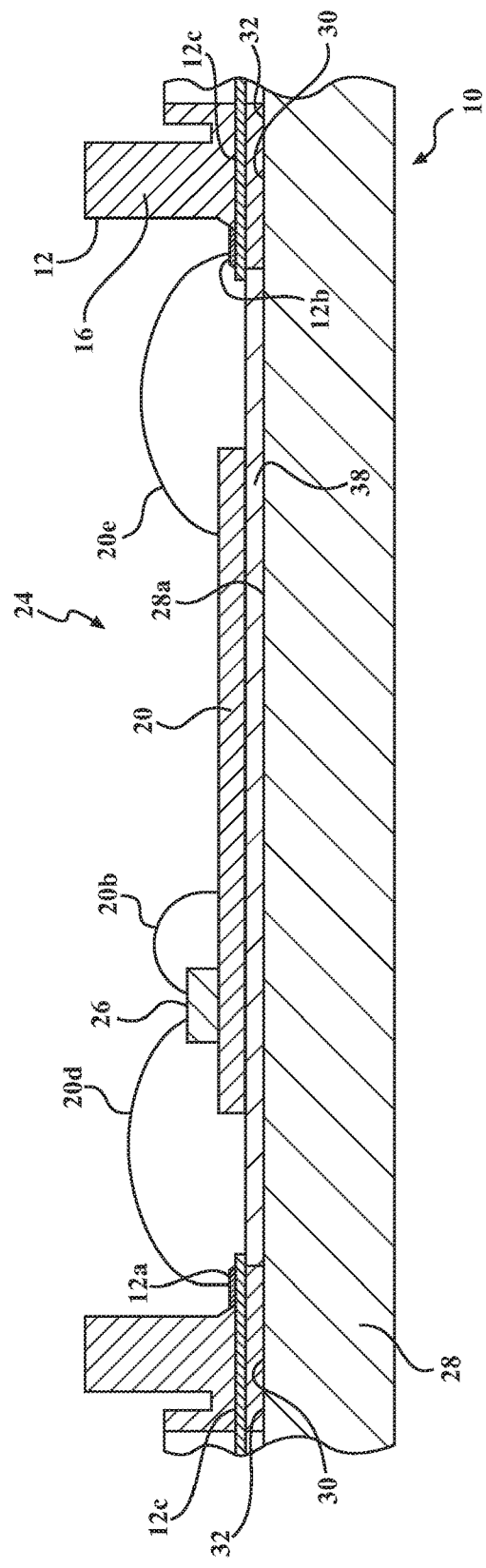
FIG. 4 is a sectional view of a third embodiment of an electronic controller, according to embodiments of the present invention.

Another embodiment of the present invention is shown in FIG. 4, with like numbers referring to like elements. In this embodiment, the core 22 is not included, and the lower sub-assembly 28 is formed as shown in FIG. 4, where the lower sub-assembly 28 does not have the recessed portion 34. In this embodiment, the TCA layer 38 is attached to the lower sub-assembly 28, but instead of being located in the recessed portion 34, the TCA layer 38 is located on a top surface 28a of the lower sub-assembly 28. In this embodiment, since the core 22 is not used, the electronic substrate 20 is connected directly to the TCA layer 38, instead of the core 22. This also eliminates the need for the use of the wire bonds 20a and 20c. The electrical component 26 is again in electrical communication with the electronic substrate 20 using the wire bond connection 20b, and the electrical component 26 and electronic substrate 20 are in communication with the lead frame 12c using the wire bonds 20d, 20e, as with the previous embodiments.

In all the embodiments, lower sub-assembly 28 being laser welded to the housing 12 in the connection areas provides a sealed connection between the lower sub-assembly 28 and the housing 12, preventing moisture, oils, ATF, chemicals, and debris from entering the cavity 24 of the housing 12. With the embodiments shown in FIGS. 1-4, the controller 10 also has the advantages of having the metal core 22 to provide suitable thermal and electrical properties.

However, in applications with less severe heat exposure, the core 22 may be eliminated, as with the embodiment shown in FIG. 4.

In the embodiment shown in FIG. 2, the TCA layer 14 has been used to attach the electronic substrate 20 to the core 22. The TCA layer 38 has been used to connect the core 22 to the lower sub-assembly 28 as shown in FIG. 3, or connect the electronic substrate 20 to the lower sub-assembly 28, as shown in FIG. 4. However, it is within the scope of the invention that other materials may be used. In alternate embodiments, either TCA layer 14, 38 may be replaced with a Pressure Sensitive Adhesive (PSA), a Room Temperature Vulcanization (RTV) adhesive, an electrically conductive adhesive (ECA), or another type of suitable adhesive.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
    an electronic controller, including:
        a housing;
        an outer wall formed as part of the housing;
        a lower sub-assembly;
        a core connected to the lower sub-assembly, the core having:
            a top surface; and
            at least one side surface adjacent the top surface;
        an electronic substrate connected to the core; and
        at least one connection area being part of the lower sub-assembly;
        wherein the lower sub-assembly is connected to the housing at the at least one connection area, and
        wherein the lower sub-assembly is formed around the core such that the lower sub-assembly substantially covers the at least one side surface, and a portion of the top surface.

2. The apparatus of claim 1,
    wherein the electronic substrate is connected to the top surface of the core.

3. The apparatus of claim 2, the core further comprising;
    a bottom surface adjacent the at least one side surface,
    wherein the lower sub-assembly is formed around the core such that the lower sub-assembly substantially covers the bottom surface.

4. The apparatus of claim 1, further comprising:
    an exposed area being part of the top surface, the exposed area uncovered by the lower sub-assembly;
    wherein the electronic substrate is connected to the core in the exposed area.

5. The apparatus of claim 1, further comprising:
    a thermally conductive adhesive layer disposed on the lower sub-assembly;
    wherein the core is connected to the thermally conductive adhesive layer.

6. The apparatus of claim 5, further comprising:
    a recessed portion formed as part of the lower sub-assembly;
    wherein the thermally conductive adhesive layer is located in the recessed portion, and a portion of the core is disposed in the recessed portion.

7. The apparatus of claim 5, wherein the thermally conductive adhesive layer is disposed between the lower sub-assembly and the core.

8. The apparatus of claim 5, wherein the adhesive layer is one selected from the group consisting of a thermally conductive adhesive layer, a pressure sensitive adhesive, a room temperature vulcanization adhesive, and an electrically conductive adhesive.

9. The apparatus of claim 1, wherein the lower sub-assembly is connected to the housing at the at least one connection area using a laser weld.

* * * * *